US012765328B2

(12) United States Patent
Thomas et al.

(10) Patent No.: US 12,765,328 B2
(45) Date of Patent: Oct. 13, 2026

(54) METHOD FOR CHECKING AND PRODUCING A COMPOSITE OF A SUBSTRATE STACK, AND HERMETICALLY SEALED ENCLOSURE PRODUCED ACCORDING TO SAID METHOD

(71) Applicants: Schott AG, Mainz (DE); SCHOTT Primoceler Oy, Tampere (FI)

(72) Inventors: Jens Ulrich Thomas, Mainz (DE); Antti Määttänen, Tampere (FI); Petri Rokka, Tampere (FI)

(73) Assignees: SCHOTT AG, Mainz (DE); SCHOTT Primoceler Oy, Tampere (FI)

( * ) Notice: Subject to any disclaimer, the term of this patent is extended or adjusted under 35 U.S.C. 154(b) by 580 days.

(21) Appl. No.: 18/312,275

(22) Filed: May 4, 2023

(65) Prior Publication Data

US 2023/0274991 A1 Aug. 31, 2023

Related U.S. Application Data

(63) Continuation of application No. PCT/EP2021/080592, filed on Nov. 4, 2021.

(30) Foreign Application Priority Data

Nov. 5, 2020 (DE) ..................... 10 2020 129 220.1
Nov. 4, 2021 (WO) ................. PCT/EP2021/080592

(51) Int. Cl.
*H10P 74/00* (2026.01)
*B23K 26/03* (2006.01)
(Continued)

(52) U.S. Cl.
CPC .......... *H10P 74/232* (2026.01); *H10P 74/203* (2026.01); *H10W 76/60* (2026.01);
(Continued)

(58) Field of Classification Search
CPC .. B23K 26/032; B23K 31/125; B23K 26/206; H10P 74/202; H10P 74/203;
(Continued)

(56) References Cited

U.S. PATENT DOCUMENTS 6,762,072 B2 7/2004 Lutz
2013/0157391 A1 6/2013 Estermann et al.
(Continued)

FOREIGN PATENT DOCUMENTS

EP 3 012 059 A2 4/2016

OTHER PUBLICATIONS

Newton's Ring's; Harvard Natural Sciences Lecture Demonstrations; Dec. 2016, Oxford St Cambridge MA 02138 Science Center B-08A (617) 495-5824, URL: https://web.archive.org/web/20161224220841/https://sciencedemonstrations.fas.harvard.edu/presentations/newtons-rings (Year: 2016).*
(Continued)

*Primary Examiner* — Christine S. Kim
*Assistant Examiner* — Tyler J Wiegand
(74) *Attorney, Agent, or Firm* — TAYLOR & EDELSTEIN, PC

(57) ABSTRACT

A process for producing and/or checking an assembly of a substrate stack includes: planarly arranging at least one first substrate against a second substrate to form the substrate stack, the at least one first substrate and the second substrate being arranged directly against one another or on one another, so that at least one contact area is formed between the least one first substrate and the second substrate at which the at least one first substrate is in direct planar contact with the second substrate, the at least one first substrate including a transparent material; detecting a radiative reflection which comes about through irradiation of the substrate stack with a radiative input on the at least one contact area; and
(Continued)

ascertaining a first bond quality index ($Q_1$) of the contact area from the radiative reflection.

13 Claims, 12 Drawing Sheets
(1 of 12 Drawing Sheet(s) Filed in Color)

(51) Int. Cl.
*B23K 26/20* (2014.01)
*B23K 26/28* (2014.01)
*B23K 31/12* (2006.01)
*H10P 74/20* (2026.01)
*H10W 76/60* (2026.01)
*H10W 95/00* (2026.01)
*B23K 103/18* (2006.01)

(52) U.S. Cl.
CPC ........... *H10W 95/00* (2026.01); *B23K 26/032* (2013.01); *B23K 26/206* (2013.01); *B23K 26/28* (2013.01); *B23K 31/125* (2013.01); *B23K 2103/18* (2018.08)

(58) Field of Classification Search
CPC ........ H10P 74/232; H01L 22/12; H01L 22/22; H10W 76/00; H10W 95/00
See application file for complete search history.

(56) References Cited

U.S. PATENT DOCUMENTS

| | | | | |
|---|---|---|---|---|
| 2013/0344302 | A1* | 12/2013 | Helie ..................... | B23K 26/57<br>156/272.8 |
| 2014/0230990 | A1* | 8/2014 | Karam .................... | C03C 27/00<br>156/64 |
| 2015/0298256 | A1* | 10/2015 | Maattanen ............ | C03B 23/203<br>65/36 |
| 2017/0278758 | A1 | 9/2017 | Harada | |

OTHER PUBLICATIONS

Notification of the Transmission of the International Search Report and Written Opinion of the International Search Authority or Declaration dated Mar. 9, 2022 for International Application No. PCT/EP2021/080592 (20 pages).
"Effects of Surface Roughness and Oxide Layer on Wafer Bonding Strength Using Transmission Laser Bonding Technique", Ampere A. Tseng, et al., Thermal and Thermomechanical Phenomena in Electronics Systems, Proceedings 10th Intersociety Conference on San Diego, CA, May 30-Jun. 2, 2006, Piscataway, NJ, IEEE, US (9 pages).
"Laser micro-welding of silicon and borosilicate glass using non-linear absorption effect induced by 1558-nm femtosecond fiber laser pulses", Takayuki Tamaki, et al., Proc of SPIE, vol. 6460, Dec. 31, 2007 (7 pages).

* cited by examiner $$Q = \left(1 - \frac{A_{Bad}}{A_{Central}}\right)$$

$$A_{Bad} = \iint \delta(g(x,y) > G)\, dx dy$$

METHOD FOR CHECKING AND PRODUCING A COMPOSITE OF A SUBSTRATE STACK, AND HERMETICALLY SEALED ENCLOSURE PRODUCED ACCORDING TO SAID METHOD

CROSS REFERENCE TO RELATED APPLICATIONS

This application is a continuation of International Patent Application No. PCT/EP2021/080592 filed on Nov. 4, 2021, which is incorporated in its entirety herein by reference. International Patent Application No. PCT/EP2021/080592 claims priority to German Patent Application No. DE 10 2020 129 220.1 filed on Nov. 5, 2020, which is incorporated in its entirety herein by reference.

BACKGROUND OF THE INVENTION

1. Field of the Invention

The present invention relates to a preparation and production process for substrate stacks, more particularly hermetically sealed enclosures, to a substrate arrangement and to a hermetically sealed enclosure.

2. Description of the Related Art

Hermetically sealed enclosures are intended, for example, to protect a component or components in the interior of the enclosure from adverse environmental conditions. In a hermetically sealed enclosure, then, sensitive electronics, circuits or sensors, for example, can be protected. In this way, sensors or medical implants, for example, in the region of the heart, in the retina or for bioprocessors, for example, can be constructed and used. They may also be used, for example, as MEMS (Micro-Electro-Mechanical Systems), barometer, blood gas sensor, glucose sensors, etc. There are known bioprocessors in use which are fabricated from titanium. Further fields for the use of an enclosure may also be found in electronics applications, such as wearables, smartphone components or enclosures, in the sector of virtual reality goggles, and similar apparatus. An enclosure according to the invention can also be employed for the production of flow cells, in the context of electromobility, for example. Further fields of use are in air and space travel, in high-temperature applications, and in the field of micro-optics.

As well as the titanium bioprocessors, it is known in principle for multiple parts to be assembled and for these parts to be arranged in such a way that in an intermediate space, an accommodation region comes about in which components can be harbored. For example, European patent specification EP 3 012 059 B1 shows a process for producing a transparent part for protecting an optical component. In that case an innovative laser process is employed.

In order to protect the electronics or, generally, any functional arrangement or functional layer, a hermetic seal of the enclosure is typically advantageous. In the context of producing enclosures, an issue which regularly arises is that of what excellence or quality the enclosures produced have and the criteria whereby the completed enclosures can be used or must be rejected. Depending on the particular case, it may be very difficult to determine whether the hermetic assembly has been secured or whether error tolerances may have occurred during the production process. In the case, for example, of electronics used which do not provide pressure sensors or the like, a defective hermetic assembly of the enclosure can ultimately be established only in operation through a premature failure of the electronics. This may lead, accordingly, to claims by the users or the purchasers, or else may systematically distort, or even prematurely end, sensitive measurements.

What is needed in the art is a way to improve known enclosures so as to be able to estimate the achievable quality of the enclosure, particularly with regard to a hermetic assembly to be produced, in order to be able consequently to draw conclusions about the quality requirements. What is also needed in the art is a way to evaluate boundary conditions or parameters whereby it is possible to establish sufficient quality of the enclosures in order, as part of a quality assurance regime, to provide a pivotal criterion as to whether completed enclosures meet the quality requirements or whether, instead, production parameters may need to be checked. What is further needed in the art is a way to provide more reliable and longer-lived enclosures.

SUMMARY OF THE INVENTION

In some embodiments provided according to the invention, a process for producing and/or checking an assembly of a substrate stack includes: planarly arranging at least one first substrate against a second substrate to form the substrate stack, the at least one first substrate and the second substrate being arranged directly against one another or on one another, so that at least one contact area is formed between the least one first substrate and the second substrate at which the at least one first substrate is in direct planar contact with the second substrate, the at least one first substrate including a transparent material; detecting a radiative reflection which comes about through irradiation of the substrate stack with a radiative input on the at least one contact area; and ascertaining a first bond quality index ($Q_1$) of the contact area from the radiative reflection.

In some embodiments provided according to the invention, a process for producing a hermetically sealed enclosure includes: planarly arranging at least one first substrate against a second substrate to form a substrate stack, the at least one first substrate and the second substrate being arranged directly against one another or on one another, so that at least one contact area is formed between the least one first substrate and the second substrate at which the at least one first substrate is in direct planar contact with the second substrate, and the at least one first substrate including a transparent material; detecting a radiative reflection which comes about through irradiation of the substrate stack with a radiative input on the at least one contact area; ascertaining a first bond quality index $Q_1$ of the at least one contact area from the radiative reflection; hermetically connecting the least one first substrate and the second substrate to one another by direct joining of the least one first substrate and the second substrate with one another in a region of the at least one contact area, so that a joining zone is formed which reaches into the at least one first substrate and into the second substrate and which directly meltingly joins the least one first substrate and the second substrate to one another; detecting a further radiative reflection, which comes about through further irradiation of the substrate stack with the radiative input on the at least one contact area; and ascertaining a second bond quality index $Q_2$ of the at least one contact area from the further radiative reflection.

In some embodiments provided according to the invention, a hermetically sealed enclosure includes: at least one planarly extending first substrate; a second substrate arranged adjacently to and in direct contact with the at least one planarly extending first substrate; and at least one functional region which is surrounded by the enclosure and is arranged between the at least one planarly extending first substrate and the second substrate. The at least one planarly extending first substrate is directly hermetically joined to the second substrate with at least one laser bond line, the at least one laser bond line reaches into the at least one planarly extending first substrate and into the second substrate and directly meltingly joins the at least one planarly extending first substrate and the second substrate to one another. The enclosure has a quality factor $Q_2$, calculated on the basis of a distance profile of $Q_2$>=0.95, and/or the at least one laser bond line is implemented with full closure around the at least one functional region and a spacing of the at least one planarly extending first substrate from the second substrate in the at least one laser bond line is consistently less than 0.75 μm.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
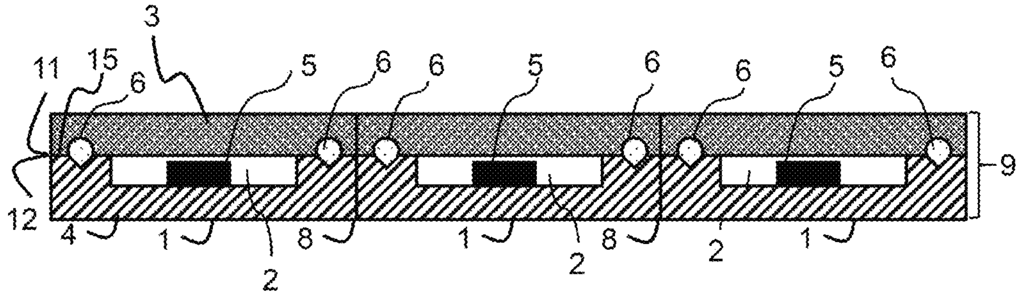
FIG. 1 shows an embodiment of a substrate stack with cavities.

The process provided according to the invention for producing and/or checking an assembly of a substrate stack comprises the step of planarly arranging at least one first substrate against the second substrate, where the at least two substrates are arranged directly against one another or on one another, so that between the at least two substrates a touch contact area is formed at which the first substrate is in direct planar touch contact with the second substrate, and where the first substrate comprises a transparent material.

In the sense of this specification, a contact area is the interface of the mutually inclined areas of the two substrates to be brought into contact. The touch contact area means a partial area of the contact area wherein the distance between the two substrates is so small that it is optically no longer measurable. Lastly, in the sense of the present invention, an acceptance area is defined, in which the distance of the substrates from one another is sufficiently small, as will be described comprehensively below, or else there is an actual contact between the two substrates. Generally speaking, the contact area here is greater than or equal to the acceptance area, and the acceptance area in turn is greater than or equal to the touch contact area.

In other words, two substrates are first arranged against one another, being stacked on one another, for example, with gravity pressing the upper, typically first, substrate against the second substrate. The orientation—above or below—here is meant only descriptively, since of course the substrates can adopt any orientation in space and even an adjacent arrangement is not intended to be outside the scope of protection. The two substrates are arranged typically lying against one another by a larger side of their extent.

If both substrates are absolutely flat, thus having no depressions, elevations or curvatures at all, something which in this absoluteness is achievable only theoretically, then first and second substrates would be in full-area touch contact with one another. The two substrates would therefore be in contact at all points on the mutually facing surfaces. In general and in the constructional reality, this is not something which can be achieved. Instead, substrates, even if only to a very small extent, are nevertheless bulged, inclined, curved, provided with elevations or depressions, and so complete touch contact is achieved only in absolute exceptional cases if at all.

In order nevertheless to be able to obtain rational starting values in the sense of a quality assurance as to which substrates or which substrate pairs, formed from the substrates to be arranged adjacently to one another, can be used to produce enclosures later on, the acceptance area is introduced for the purposes of this invention, said area representing that part of the contact area for which the distance between the two substrates is below a certain value. For example, the acceptance area can be defined as describing that area or that fraction of the contact area at which the distance between the substrates is less than 2 μm, optionally less than 1 μm and optionally less than 0.3 μm. These distance values can be identified advantageously by a radiative reflection pattern and assigned to the corresponding area, as will be elucidated in more detail later on in the description. The distance between the substrates may even possibly be 5 μm or less and nevertheless the corresponding region can be assigned to the acceptance area; with regard to the status of the description of the invention, this is also a subject of further optimization of the presented method.

It may be advantageous if the first substrate is a transparent substrate or comprises transparent material, thus being regionally transparent at any rate, and this being the case at any rate for a particular wavelength range, specifically in order on the one hand to introduce the later laser bond line through the first substrate to complete the enclosure and on the other hand to evaluate the quality of the substrate contact by an optical element.

For the purposes of the present invention, the substrate stack or the enclosure is typically provided by a laser bond method or with a laser bond line by which the first substrate is joined with direct hermetic sealing to the second substrate, which is arranged adjacent to the first substrate. A laser bond line typically has a height HL perpendicular to its connecting plane. In some embodiments, the laser bond line reaches into the material of the substrate arranged above the laser bond line by the height HL or less, or else by HL/2 or less. Conversely, the laser bond line reaches into the material of the substrate which lies below the laser bond line, for example, by the height HL/2 or more.

If the enclosure comprises only the first and second substrates, in order to form the enclosure, then the first substrate is joined directly to the second substrate and the enclosure has, for example, one laser bond line. The enclosure in that case additionally has a connecting plane or a joining region in which substrates are joined to one another. In a further example, the enclosure may be composed of three or more stacked substrates, with the first substrate joined directly to the second substrate and the second substrate to a base substrate which also forms a floor of the enclosure. In this example, the enclosure has two contact zones or two joining regions in which the enclosure is joined. The enclosure may have two or more connecting planes.

For example, the first substrate is joined meltingly and directly to the second substrate, without the need to use promoters or adhesives, for example. In a physical respect as well, the laser bond line may be placed in one of the two substrates to be joined, meaning that the target point of the laser may lie in one of the two substrates, with the laser bond line always extending jointly into the two substrates to be joined. In the joining step or in the laser bond line, material of the one substrate mixes meltingly with material of the other substrate to produce the secure and nonpartable hermetic assembly between the one substrate and the other substrate.

If the substrates are to be arranged directly against one another or on one another, this means that the at least two substrates are mounted or arranged against one another such that they come to lie planarly against one another, in particular without other materials or layers being present or inserted between the at least two substrates. It is possibly the case, for technical reasons, that extremely small gas inclusions or impurities, such as dust particles between the substrate layers, cannot be avoided. This may also result from possible unevenness, in the microregion between the substrate layers or on the surfaces of the substrate layers as well. If the joining zone generated by the laser, or laser bond line, provides a height HL, for example, of between 10-50 μm, a hermetic seal can be ensured by the laser bond line, since the possible distance between the two substrates can be bridged.

One of the laser bond lines or the laser bond line may enclosure the functional region or round it at a distance DF. The distance DF all around the functional region may be constant, and so the laser bond line is arranged at approximately the same distance around the functional region on all sides. Depending on specific application, the distance DF may also vary, and this may possibly be more favorable from a production standpoint if, for example, a plurality of enclosures are joined in a common operation, or if the functional region has a round or arbitrary form and the laser bond line is drawn in a straight line. In the event that the cavity has optical properties, being shaped in the form of a lens, such as a collecting lens, for example, the laser bond line may also be formed around the cavity and may possibly have different distances from the cavity. An enclosure may also comprise multiple cavities.

As part of the method, a radiative reflection is detected which comes about through the irradiation of the substrate stack with a radiative input at at least one contact area of the substrate stack. In other words, the substrate stack is irradiated or illuminated, and consequently at the surfaces of the substrates a radiative reflection is generated from the radiative input. This radiative reflection may be the reflected radiative input, which is reflected to a certain extent at one of the surfaces. In the case of two substrates, four surfaces may be relevant for this purpose, at which such reflection can already take place. These are the outside of the first substrate, the inside of the first substrate, the inside of the second substrate, and the outside of the second substrate.

In other words, the first substrate has an outside or else outer flat side which is aligned to the surroundings and which is substantially planar or flat. Bordering the outer flat side and oriented typically at a right angle to the outer flat side, configured, for example, to run all round the margin of the outer flat side, is an all-round narrow side. In some embodiments, the first substrate can be described as a plate or block, having two large-area sides (i.e., the outside and the inside) and also four smaller sides arranged between the large-area sides, these smaller sides being, in particular, perpendicular to the two large-area sides and bordering the large-area sides. In that case the four smaller sides together form the all-round narrow side, and the top side forms the outer flat side of the first substrate. This top side typically has a greater surface area than the smaller sides of the all-round narrow side together. These statements relating to sizes and proportions may also be valid analogously for the second substrate.

In a region in which the two substrates are in touch contact, there is no reflection, or no notable reflection, at the insides of the two substrates, and so this fraction is comparatively small. If, however, the two substrates come apart, and there is therefore a distance between the two substrates, with the two substrates in this partial region thus not being in touch contact, then the radiative input is reflected to a certain fraction in each case at all four surfaces of the two substrates.

In the case of more substrates, such as three substrates, for example, it is possible correspondingly to take six or more surfaces into account. On the other hand, for example, the lower substrate or substrates may be made non-transparent such that there is no penetration by radiation or radiation is extinguished there. In that case, even in the case of a plurality of substrates, there may be only, for example, be four surfaces to be considered, or fewer surfaces than twice the number of substrates.

From the radiative reflection which is incident from the substrate stack into a measurement or observation device, a first bond quality index $Q_1$ of the contact area of the substrate stack is determined. In this case the radiative reflection may come about directly at the at least one contact area of the substrate stack. The radiation concerned here is optionally backscatter at an optical interface, namely a surface of the first or second substrate. If a gap remains between the contact areas of the first or second substrate which lie against one another, in other words if even only a small distance is present between the two contact areas, then there may be a path difference of the radiation between the backscatter at the first contact area and the backscatter at the second contact area. The path difference may come about as a result of a different distance traveled by the optical radiation. If the two backscatters are superimposed in a detector, for example, it is therefore possible to ascertain a superimposition in the form, for example, of an interference pattern. By evaluating the interference pattern, it is possible ultimately at the respective location of the contact area to ascertain the distance of the first contact area from the adjacent second contact area.

In principle it may be advantageous if the incident radiation is fundamentally reflected at the contact face, in other words if there is always backscattering, irrespective of whether the contact areas have a residual distance from one another or whether they are in full contact (touch contact) with one another. From the shape of the backscatter, more particularly the resultant interference pattern, it is then possible more easily to ascertain a potentially remaining distance. For example, the shape of the interference pattern may be dependent on the distance between first and second contact areas, and hence from the shape of the interference pattern it is possible to infer the distance. For this purpose it may be advantageous if backscattering enters the detector even when a distance is absent.

Furthermore, for the determination of the bond quality index as proposed here, it may be particularly advantageous if the two contact areas are arranged close to one another. It is therefore also possible if there are no further components, adhesion promoters or adhesives arranged between the contact areas, with the two substrates instead being joined directly and meltingly to one another. If there were to be a further component, such as a glass frit or an application of an adhesive, between first and second contact areas, then the two contact areas would potentially not be in planar touch contact. This may make it more difficult to determine the bond quality index. The objective of the substrates joined planarly against one another would then possibly not even be met at all if further materials such as an application of adhesive are arranged between the contact areas.

In the case of the directly melting joining of two substrates to one another, therefore, it may be particularly significant that the substrates of the enclosure are joined directly to one another without the additional use of adhesives, since any adhesive, glass frit or other substrate may have to be avoided, for various reasons. Hence through the use of fewer components it is possible to simply the production process. This may, moreover, increase the achievable purity, since such extraneous substances may also evolve gas, possibly even into the cavity, where present. Lastly, such additional substances such as connectors or adhesive layers may also adversely affect the quality or durability of the hermetic nature of an assembly. If, for example, there are multiple layers needed, two or more, for example, and if in that case an applied or adhered interlayer were to be provided on one of the substrates, then this cannot be interpreted as “one-piece provision of a substrate”, even if it is produced or constructed from a material of the same kind. In that case, indeed, it may not be possible to ensure a hermetic join in the form that is made possible by the direct laser joining developed further in the present specification. Where separate layers and/or materials are employed, moreover, stresses may be “frozen” in the substrate in the course of production, and can lead to damage to or premature failure of the product.

Admittedly, the finished product, in which the substrates are joined to one another, could be referred to as one-piece, since the substrates typically enter into an inseparable assembly with one another. Nevertheless, the enclosure has not been produced from a one-piece precursor. If an interlayer such as an adhesive or frit or the like has been employed during the production of an enclosure, this interlayer can also be shown and therefore differentiated in the case of the joined product later as well. The direct laser joining of two substrates to one another therefore represents a distinctive product improvement in the case of which, in turn, new difficulties may arise which were simply not a problem with conventional products connected using adhesive or frit or other additional layers. This may also include the present measurement method and the product checked using the measurement method, for which the direct lying of two substrates against one another and their assembly are hardly comparable with conventional products.

It is possible, for example, to determine the bond quality index $Q_1$ if $Q_1=1-(A-G)/A$. Here, A is the area representing the contact area of the substrates. G is the area of acceptance area, with the acceptance area G representing that area at which the distance between the substrates is less than a specified value. This specified value at which the acceptance area G is assumed obtains optionally when the distance between the two substrates is less than 5 μm, optionally less than 2 μm and optionally still less than 1 μm.

If the contact area were not to have any defects, then the acceptance area G corresponds to the contact area A, and the bond quality index would be $Q_1=1$. If, on the other hand, the entire contact area were to be deficient, then the acceptance area G=0 and the bond quality index $Q_1=0$. Depending on the areal fraction of the acceptance area, then, the bond quality index $Q_1$ corresponds to a number between 0 and 1.

The bond quality index $Q_1$ is optionally greater than or equal to 0.8, optionally greater than or equal to 0.9 and optionally still greater than or equal to 0.95.

The radiative input is generated optionally by a monochromatic radiation source. The radiative input may also be generated by a spectrally adapted radiation source. The radiative input may be a low-energy input, in which case the radiative input in particular has a radiant power which does not lead to melting or incipient melting of the substrate or substrates. Alternatively to this, a non-monochromatic radiation source may be used, if, for example, the detector implements a narrowband bandpass filter either by a corresponding component, a component assembly, and/or by software.

In other words, the detector is configured to detect the radiative reflection optionally monochromatically or at least narrowband-chromatically. This radiative reflection may be monochromatic or narrowband-chromatic or extracted from a radiative reflection. In this case, for example, separation via software of one or more color channels from an image file is possible. The color channels can be read out separately from the detector when the image is recorded. And/or a narrowband filter, such as a bandpass filter, may be inserted before the detector. Lastly, for example, the monochromatic or quasi-monochromatic irradiation source—more particularly a gas vapor lamp or a laser—may be employed in an otherwise darkened exposure cabin. It is possible accordingly to select a monochromatic or quasi-monochromatic range from the radiative reflection, through the selection, for example, of a color channel in a digitized image file, for example.

The radiative reflection optionally generates a pattern, more particularly an interference pattern, and further, in particular, this pattern is generated from the superimposition of the radiative input with the backscatter at the at least one contact area of the enclosure. It is then possible to configure the measurement or observation device such that it recognizes or detects the interference pattern and is able from it to calculate or deduce the distance between the two substrates.

The pattern from the radiative reflection may have an arrangement in which the pattern extends around one or more defects. In other words, the pattern may be arranged particularly around those places in which the at least two substrates are not in touch contact. In that case it is particularly simple to use the measurement or observation device to locate the places at which the at least two substrates are not in touch contact. A defect here may be characterized in that the distance between the substrates at these defects is greater than 5 μm, optionally greater than 2 μm and optionally greater than 1 μm, or else optionally greater than 0.3 μm. In other words, a defect may be located at exactly the point where the criteria for an acceptance area G are not fulfilled. In this case, the contact area between the at least two substrates may be completely divided into acceptance area G and defect F.

The corresponding regional assignment may be identifiable, in some embodiments, from an interference pattern in the form of Newton's rings. If the radiative input is set in the range of visible light, for example with $\lambda$=500 nm, each Newton ring exhibits a height difference of $\lambda/2$=250 nm. If, for example, the occurrence of three Newton rings is set as the boundary criterion for the determination of whether there is an acceptance region present, then in an optical image analysis of radiative reflection from the enclosure, the region defined as the acceptance region may be that for which the distance between the substrates is less than or equal to $3*\lambda/2$=750 nm.

The substrate stack is able to harbor at least one functional region, with the functional region taking the form, for example, of a harboring cavity for accommodating at least one harbored item. In other words, the substrate stack forms an enclosure which features a region to be protected or an item to be protected. The covering substrate, which is typically the first substrate, may have an outer flat side, also referred to as top side or outside, and a narrow side all round.

The substrate stack may additionally have a useful region N. For example, the region of the substrate stack in which there is a functional region may be defined as the useful region N. A substrate or a substrate stack may also have a plurality of functional regions, with the sum total of the functional regions adding up to form the useful region N. This may be the case, for example, if first of all the substrates are prepared and joined and later a plurality of enclosures are singularized from the substrate stack. The useful region N is therefore always smaller than the contact area A.

For calculating the first bond quality index $Q_1$, it is possible to employ only the useful region N; for example, $Q_1$ may be determined as $Q_1=1-(N-G)/N$.

After the step of determination of the bond quality index $Q_1$, the quality-inspected substrate stack may be joined by a laser method, for example. In the context of the present invention, it has emerged that the information of key significance may be to have the information, even before the joining step, as to how the bond quality index $Q_1$ was before the joining. The reason is that it is indeed the case that by the laser joining method and of the correct adjustment of the laser, it is also possible to join those regions for which there is a distance between the two substrates, even if the distance between the two substrates is greater than 1 μm, or greater than 2 μm, or even greater than 5 μm. Hence it has emerged that the laser bond line can be set such that it has a height of up to 50 inn, or may even be up to 75 inn, or else up to 100 inn in height. Relatively small distances between the substrates can therefore be bridged with the laser bond line, then. It has emerged, however, that if there are distance ranges which were present before the joining, if, therefore, the laser bond line is introduced into the substrate in a fault region F or outside a touch contact area, there may be stresses occurring in the substrate stack that may adversely affect the properties of the later enclosure. In certain circumstances, these substrate stresses may no longer be measurable, or may be measurable only at increased cost and complexity, in the finished product, and so a premature failure may occur without this being foreseeable. In order to allow this to be manageable, therefore, it may be advantageous to compare the bond quality index $Q_1$ determined before laser joining with a bond quality index $Q_2$ determined after laser joining. From this relationship it is then possible to draw conclusions about the residual stresses or stresses that possibly occur in the complete enclosures.

An enclosure provided in accordance with the present description may also comprise different materials; for example, a glass/metal assembly may be advantageous, where the glass is joined directly and unmediatedly with the metal in a laser joining method at the contact area. For example, the first substrate may comprise a transparent material, and the second substrate a metal material. The transparent substrate may lie as a cover on the metal substrate. As soon as there is a touch contact area between first and second substrates, the Q index can be determined using the method presented here. It is possible accordingly, for example, to estimate the quality of the joined connection or else the hermetic quality of the enclosure. From the comparison of a first index $Q_1$ generated before the joining operation with the index $Q_2$ generated after the joining operation, moreover, it is also possible to ascertain whether physical stresses possibly affecting the lifetime of the enclosure have been frozen-in in the enclosure or in the or one of the one transparent substrate(s).

Also provided according to the invention is a method for producing a hermetically sealed enclosure comprising at least two substrates. This represents in particular the completion of the method already described above in which a substrate stack is measured. The method comprises the planar arrangement of at least one substrate against a second substrate, with the at least two substrates being arranged directly against one another or on one another, to form a substrate stack, with there being formed, between the at least two substrates, a contact area at which the first substrate is in direct planar touch contact, at least at one place, with the second substrate. As described above, the complete contact area is also a touch contact area only in an ideal case; typically and in reality, the contact area is divided into a touch contact area part and a further part at which the two substrates are not in touch contact. This further part, at which the two substrates are not in touch contact, is divided up further, for the purposes of the present invention, into acceptance area G, in which the distance between the two substrates is tolerably small, and the remaining region of the contact area, referred to as defect F. The first substrate comprises a transparent material at least regionally and transparently at least for one wavelength range, so that a laser is able to pass through the first substrate to form the laser joining line and/or so that the radiative input and/or the radiative reflection is able to pass through the first substrate.

The method further comprises the detection of a radiative reflection which comes about through the irradiation of the substrate stack with a radiative input on at least one contact area of the substrate stack. From the radiative reflection, furthermore, the first bond quality index $Q_1$ of the contact area of the substrate stack is determined. The first bond quality index $Q_1$ is therefore determined optionally before the joining of the at least two substrates to one another, but at least captures the measurement data needed for calculating $Q_1$.

The method further comprises the following step: hermetic connection of the at least two substrates to one another by direct joining of the at least two substrates to one another in the region of the at least one contact area of the enclosure. The joining of the at least two substrates to one another forms a joining zone which reaches on the one hand into the first substrate and on the other hand into the second substrate and directly meltingly joins the at least two substrates to one another. In other words, by the joining step, there is locally confined melting of the material both of the first substrate and of the second substrate such that material of the first substrate mixes with the material of the second substrate and forms a joining zone which consists of mixed material of the first and of the second substrates. In the joining zone there may be no further material or extraneous material needed or present, meaning that material of the first substrate is joined with material of the second substrate, or the materials are melted one into the other, directly and unmediatedly. The joining zone at the moment of joining forms a kind of convection zone in which there is exchange of material between the two substrates.

After the step of the joining of the at least two substrates to one another, the following step follows: detection of a further radiative reflection, which comes about through the further irradiation of the substrate stack with the radiative input at the at least one contact area of the enclosure. From the further radiative reflection it is possible ultimately to determine a second bond quality index $Q_2$ of the contact area of the enclosure joined with hermetic sealing.

This second bond quality index $Q_2$ is determined for example as $Q_2=1-(A-G)/A$ or else $Q_2=1-(N-G)/N$. Here, A is the area of the first contact area, G the acceptance area and N the area of a useful region. The useful region may be a product of a plurality or unity of cavities and/or functional regions.

The bond quality index $Q_2$ is optionally greater than or equal to 0.95, optionally greater than or equal to 0.99 and optionally still greater than or equal to 0.999. $Q_2$ may be greater than $Q_1$ or may be at least equal to $Q_1$.

The hermetic assembly of the at least two substrates may be checked by determining a distance profile between the at least two substrates. Such a check of the hermetic assembly may also be accomplished if $Q_2$ satisfies minimum requirements for the assurance of the hermetic assembly.

The step of hermetically connecting the at least two substrates is accomplished optionally by a laser joining method. The laser in this case generates a joining zone which reaches on the one hand into the first substrate and on the other hand into the second substrate. Within the laser joining method, the laser is guided in particular all around the substrate and/or all round one or more cavities. The laser in this case may be guided around a plurality of cavities together or around each cavity individually, for the individual hermetic joining of each cavity.

The substrate stack may be irradiated for example with a coaxial exposure device in order to achieve uniform exposure over the substrate stack or the enclosure. In this case it is possible to use a light array comprising a multiplicity of light sources such as LEDs, i.e., for example, an LED screen, and to direct the radiative input onto the substrate stack and/or the enclosure. In some embodiments, the radiative input from the light array may be directed onto the substrate stack and/or onto the enclosure by, for example, a beam splitter or semitransparent optical element. The substrate stack is, for example, round, being present, for example, as disks of a wafer, and has a diameter $D_S$; furthermore, for example, the beam splitter or the semitransparent optical element may likewise be round and have a diameter $D_{OE}$ corresponding to $D_{OE}\geq\sqrt{2}\times D_S$. This may be advantageous particularly when the beam splitter or the semitransparent optical element is arranged at an angle of about 45° to the surface of the first substrate. In that case, particularly uniform illumination of the substrate stack or of the enclosure is possible. The radiative reflection may then be detected by a detector device.

For improving the signal quality obtained with the detector device, the radiative reflection can be further improved. For example, with the detector, it is possible first to record a background measurement without object and without radiative input, in a step $M_B$, and to detect a spatially resolved intensity $I_B$. It is then possible to record the radiative input without object in a step $M_W$, by detecting the spatially resolved intensity $I_W$. Lastly, the object—that is, the substrate stack or the enclosure—can be detected with the detector device in a further step $M_O$ or with the intensity $I_O$. Lastly, the spatially resolved intensities $I_B$, $I_W$ and/or $I_O$ may be superimposed as follows to give the final intensity IF:

$$I_F = \frac{(I_O - I_B)}{(I_W - I_B)} \times \text{gain}.$$

In this equation, gain is a possible amplification factor of the detector. Furthermore, the signal quality of the image obtained may also be increased by averaging over at least two images of the same setting, since in this way it is possible to suppress the image noise.

It is possible, subsequently, to specify a maximum distance of the distance profile between the first substrate and in the second substrate. If the maximum distance is exceeded, i.e., if such an exceedance of the maximum distance is found by either of $Q_1$ or of $Q_2$, then in an automated method it is possible to break up the enclosure and clean it; the joining method can be adapted or ultimately the enclosure can be removed from the process, so that it is not used.

After the hermetic connection of the at least two substrates, a further check of the hermetic assembly may take place via determination of a second distance profile. The second distance profile may then be compared with the first distance profile, in order to visualize the changes induced by the laser joining.

The first substrate is optionally a covering substrate and the second substrate may be a base substrate. The covering substrate in that case may bear directly and unmediatedly against the base substrate and may therefore form the substrate stack or enclosure. Alternatively, furthermore, there may be an intermediate substrate arranged between the covering substrate and the base substrate. In that case the covering substrate is arranged directly and unmediatedly against the intermediate substrate and the base substrate directly and unmediatedly against the intermediate substrate. In other words, the intermediate substrate is located between covering substrate and base substrate.

Also provided according to the invention is a hermetically sealed enclosure which has been produced or checked by the method described above.

A hermetically sealed enclosure provided in accordance with the invention comprises at least one planarly extended first substrate and a second substrate which is arranged adjacent to the first substrate and is in direct touch contact with the planarly extended first substrate. In this case, there is a contact area formed between the first substrate and the second substrate, and typically the touch contact area forms only a sub-quantity of the contact area, since typically, owing to unpreventable production tolerances, the first and second substrates are in touch contact only regionally.

The hermetically sealed enclosure further comprises at least one functional region which is surrounded by the enclosure and is arranged in particular between the first substrate and the second substrate. The first substrate is directly hermetically joined to the second substrate, arranged adjacently to the first substrate, with at least one laser bond line. The laser bond line here reaches on the one hand into the first substrate and on the other hand into the second substrate. The laser bond line directly meltingly joins the at least two substrates to one another.

The hermetically sealed enclosure has a quality factor $Q_2$, calculated on the basis of a distance profile, of greater than or equal to 0.95. Alternatively or cumulatively, the laser bond line of the enclosure is implemented with full closure around the functional region, and any possible spacing of the first substrate from the second substrate in the laser bond line is consistently less than 0.75 μm, optionally less than 0.5 μm and optionally less than 0.3 μm. The checking of the enclosure may therefore be established such that a resolution achievable with the radiative reflection need not be less than 250 nm or more, meaning, for example, that visible light in the wavelength region of 500 nm can be used as radiative input. The checking of the enclosure may therefore be carried out and verified in a particularly simple way. Furthermore, with a radiative input of adapted wavelength of, for example, around 200 nm, it is even possible to resolve a spacing of 0.1 μm, and so a possibly occurring spacing of the first substrate from the second substrate—which may be less than or equal to 0.1 μm—can be accepted in the laser bond line.

The first substrate is characterized, for example, in that it is flat. More particularly the first substrate is planar, thus having a uniform, very largely flat surface, and especially so on its inside. The mean roughness Ra on its inside is optionally less than or equal to 20 nm.

Alternatively or cumulatively, the second substrate is flat, in other words more particularly planar. It optionally has a mean roughness Ra of less than or equal to 20 nm on its inside. The respective inside of the first or second substrate here is the side facing the adjacently arranged substrate.

The first substrate optionally forms with the second substrate a contact plane or a contact region at which the first substrate is optionally in direct touch contact with the second substrate. In some embodiments, the contact plane is free from extraneous materials, thus further being free in particular from connecting materials, such as adhesive or glass frit.

The second substrate may be configured as a base substrate. The base substrate is hermetically joined to the first substrate with the same laser bond line. Alternatively the enclosure may have an intermediate substrate which is arranged between the base substrate and the first substrate. In that case the base substrate is joined to the intermediate substrate in a first connecting plane and the first substrate is joined to the intermediate substrate in a second connecting plane.

The at least one laser bond line has a thickness in a direction perpendicular to the planar extent direction of the first substrate.

The functional region of the enclosure comprises a hermetically sealed harboring cavity for accommodating a harbored item, such as an electronic circuit, a sensor or MEMS.

The first substrate is transparent to at least one wavelength range at least partially and/or at least regionally.

The first substrate may consist of or comprise glass, glass-ceramic, silicon, sapphire or a combination of the aforesaid materials. The first substrate may also consist of or comprise ceramic material, more particularly oxide-ceramic material.

The enclosure is optionally configured in the region of the laser joining line such that there is a residual stress zone there. The residual stress zone may be characterized in that in the region of the residual stress zone $Q_2/Q_1$ is greater than or equal to 1, optionally $Q_2/Q_1$ is greater than or equal to 1.1.

The laser joining line of the enclosure, in the case where $Q_2/Q_1$ is greater than/equal to 1, optionally $Q_2/Q_1$ is greater than/equal to 1.1, may have a fluctuating maximum width of the laser joining line. Optionally the laser joining line of the enclosure may have a fluctuating width of a region having altered optical properties of the laser joining line.

Below, the invention is elucidated in more detail by exemplary embodiments and with reference to the figures, with identical and similar elements being provided in some cases with identical reference numerals, and where the features of the various exemplary embodiments may be combined with one another.

FIG. 1 shows an embodiment of a substrate stack 9 provided according to the invention in a lateral sectional view. The substrate stack 9 has a plurality of three enclosures 1 shown here, which can still be separated at the separation lines 8 represented, in a later operation. A first substrate 3 is configured as a covering substrate and cover the enclosures 1 jointly. This substrate is later divided on singularization into the individual enclosures. A second substrate 4 forms the underside of a cavity 2, with each cavity 2 being hermetically sealed all around with a laser joining line 6. In the cavity 2 there is disposed a harbored item 5. In this case, the enclosures 1 shown are of substantially identical construction to one another, leaving aside the fact that certain enclosures are on the outside whereas other enclosures are cut on both sides along the cut lines 8. The cavity 2 is introduced, for example, abrasively into the second substrate 4, in other words hollowed out of the second substrate 4. First substrate 3 and second substrate 4 with respect to one another form a contact area 15 which in this case is partly interrupted and at which the inside 11 of the first substrate 3 is in contact with the inside 12 of the second substrate 4, more particularly in touch contact. In the region of the contact area the laser joining line 6 is introduced as well.

Figure 2:
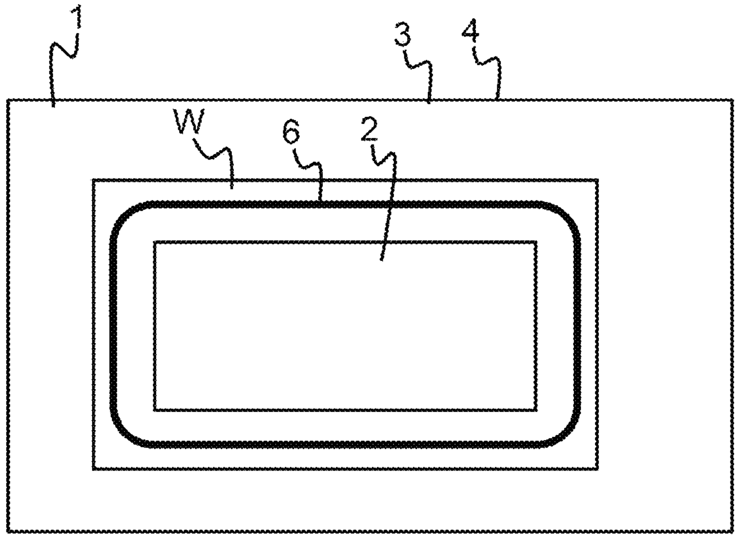
FIG. 2 shows an embodiment of a facing view onto an enclosure provided according to the invention.

Referring to FIG. 2, a plan view of an enclosure 1 provided according to the invention is shown which can be obtained, for example, as singularization from the substrate stack 9 shown with FIG. 1. The first substrate 3 is atop the second substrate 4. Introduced all around the cavity 2 is the laser joining line 6, which seals the cavity hermetically to the outside. The approximate width of the laser joining line 6 is identified by the reference sign W and, for reasons of emphasis, with an all-round line.

Figure 3:
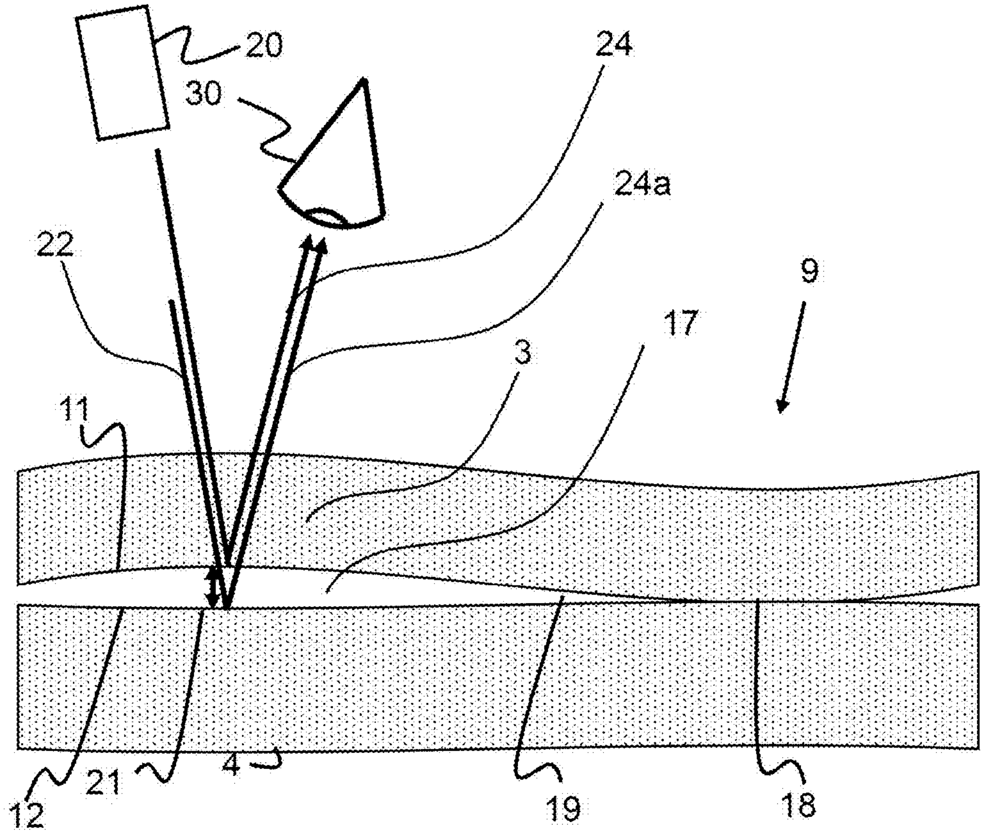
FIG. 3 shows a substrate stack with acceptance region and fault region.

FIG. 3 shows a detail of a substrate stack 9, with fault region 17, touch contact region 18 and acceptance region 19 being visible. The double arrow 21 describes the position of the greatest height of the defect 17.

The radiative input 22 is directed onto the substrate stack 9, and in the region of the defect site 17 the radiative input is reflected both at the inside 11 of the first substrate 3 and at the inside 12 of the second substrate 4. The radiative reflection 24, 24*a* can be detected with the detector 30. The path difference between the radiative reflection 24 and the radiative reflection 24*a* leads in this case to an interference pattern which is generated by the two radiative reflections relative to one another. These are in each case Fresnel effects, i.e., for example, reflections which in the case of glass without non-reflection coating amount in each case to about 4% per interface. The radiative input 22 in this case comprises monochromatic light.

Figure 4:
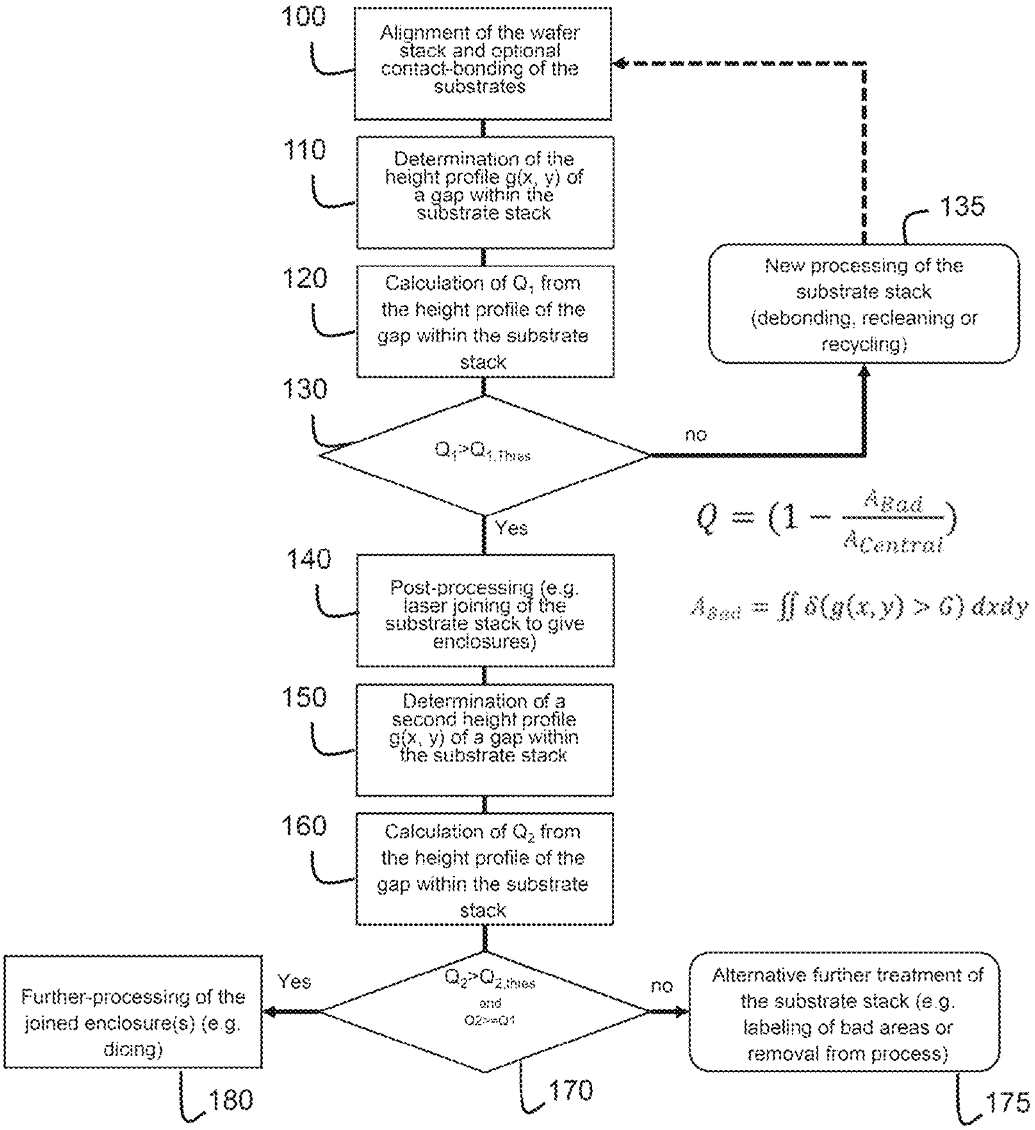
FIG. 4 shows an illustrative flow diagram of a method.

FIG. 4 shows steps of a method for producing or checking the hermetic assembly of a substrate stack. In a first step 100, a first substrate is arranged planarly against a second substrate. In a second step 110, from the detection of a radiative reflection which comes about through the irradiation of the substrate stack with a radiative input 22 on at least one contact area of the substrate stack 9, a height profile of the gap within the substrate stack 9 is ascertained. In a step 120, from the height profile, the bond quality index $Q_1$ is ascertained. In a decision step 130 a determination is made, if the bond quality index $Q_1$ determined in step 120 is greater than a specified, permitted threshold value $Q_{1thr}$, it is determined that the substrate stack can in that case be released for further processing, in other words more particularly for laser joining by laser joining lines 6. Should $Q_1$, however, be less than the achieved or desired $Q_{1thr}$, then in step 135 the substrate stack 9 is for example reworked, meaning that it is disassembled, recleaned where appropriate or supplied to a different reutilization.

In step 140 the substrate stack 1 is then laser-joined to form the enclosure or enclosures. Subsequently a second height profile of the gap within the substrate stack of the attached substrate stack 1 is determined in the step 150, and from this $Q_2$ is calculated in the step 160. In the step 170, it is ascertained whether $Q_2$ is greater than a threshold value $Q_{2thr}$ specified for $Q_2$. For example, $Q_{2thr}$ is less than or equal to $Q_{1thr}$. Optionally in step 170, likewise, there is determination or checking as to whether $Q_2$ at any rate is equal to or greater than $Q_1$. If both conditions are met, the joined enclosure 1 or enclosures 1 can be processed further in a step 180, by the removal, for example, of the plurality of enclosures 1 from the wafer stack 9 at the separating line 8. If, conversely, one of the two conditions or both conditions specified in step 170 has or have not been met, then in a step 175 an alternative further treatment of the substrate stack 9 may be introduced; in this case, for example, there may be a marking of fault regions F, 17 or the wafer stack 9 may be supplied for utilization.

Figure 5:
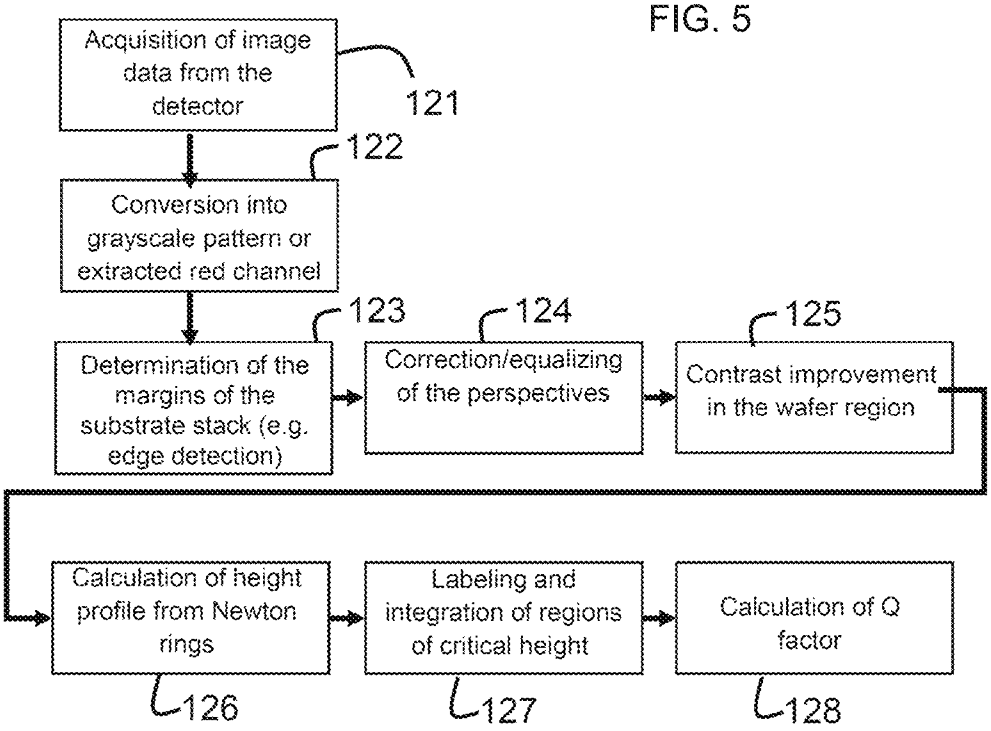
FIG. 5 shows further steps of a method.

FIG. 5 describes certain steps which can be carried out in order to calculate the bond quality index $Q_1$ and/or $Q_2$. In a step 121, image data from the detector 30 are obtained first of all, by an operational computer tailored to that purpose, for example. In step 122, the image data obtained in step 121 are converted to a grayscale pattern or the red channel is extracted from the image data. It may be processed with an image-processing functionality which runs, for example, on the same computer on which the image data are also obtained with step 121. With step 123, the physical margins of the substrate stack 3, 4, 9 are determined in the recorded image from the detector 30, in the form of a corner recognition, for example. In a step 124, the perspectives can be corrected or equalized, should it be necessary. In a step 125, a contrast improvement may be performed, in the region of the substrate stack, for example. In this case, for example, it is possible simply to subtract the darkest gray background value and to generate a grayscale image from a monochrome image. In a step 126, lastly, a height profile is calculated from the image data obtained with the detector 30, on the basis of observed Newton rings, for example. After that, in a step 127, it is possible to label and integrate regions in which critical heights or profiles have been found. This relates in particular to regions which have been found as fault region F, 17. In a step 128, lastly, the respective Q factor $Q_1$ or $Q_2$ is calculated from the image data corrected or improved as described above.

Figure 6:
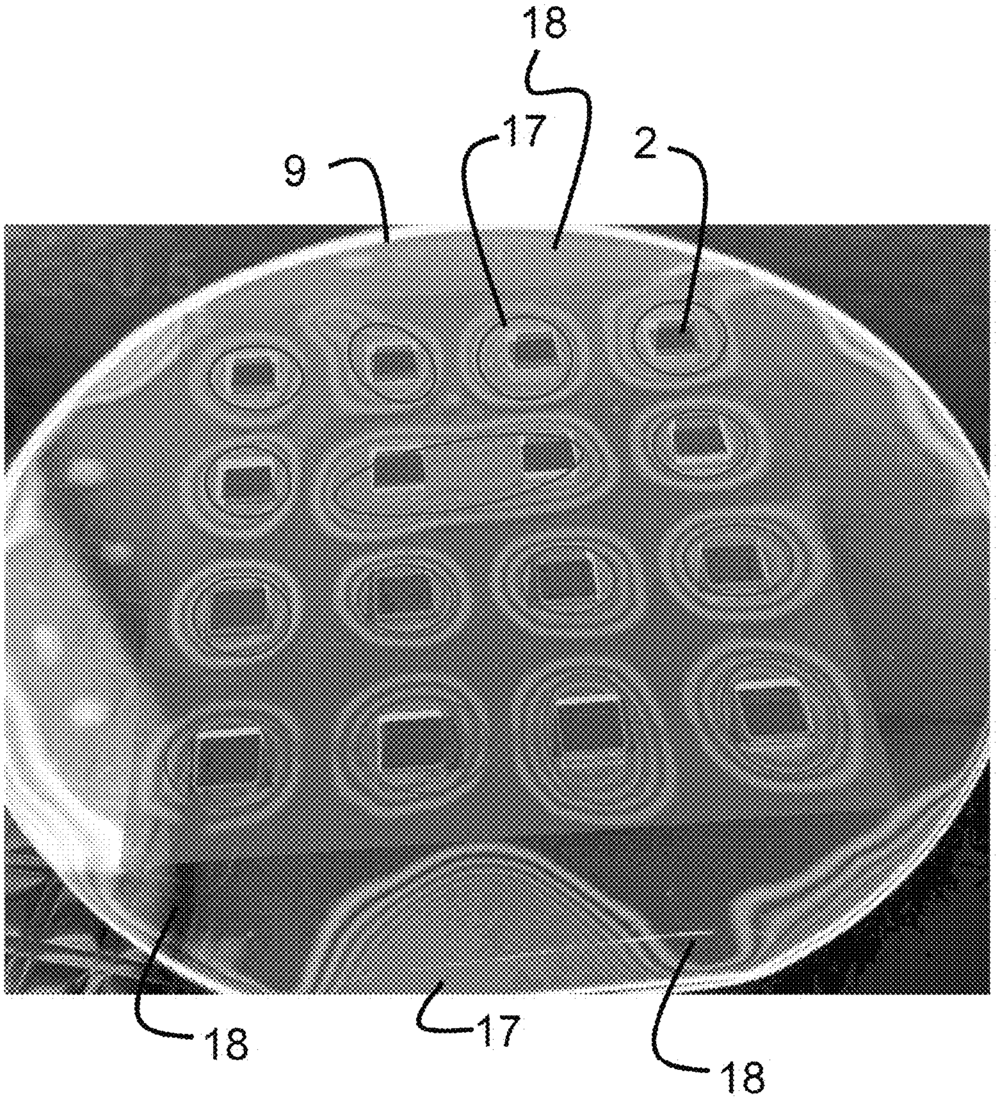
FIG. 6 shows photographic representation of measured radiative reflections for determining a first bond quality index $Q_1$.

FIG. 6 shows a photographic representation of a substrate stack 9 before the bonding operation. The substrate stack 9 has a plurality of enclosures 2, represented here in blue. Visible around the enclosures 2 are Newton rings, which result from the growth in the distance between the substrates there. The red-outlined regions shown in the photo of FIG. 6 are the regions at which the bond quality index $Q_1$ is less than or poorer than 0.5. These are fault regions 17. In this region the distance between the two substrates is, for example, greater than 1 μm. Along the margins of the substrate stack 9 as well there are fault regions 17 of this kind. At the places where there is no pattern perceptible, the distance between the substrates exhibits no change or only insubstantial change. As it can be assumed that the substrates, when they lie on one another, always have regions which are in touch contact with one another, regions which show no patterns in the form of Newton rings may be defined as touch contact area. This also applies to the regions indicated by the reference sign 18.

Figure 7:
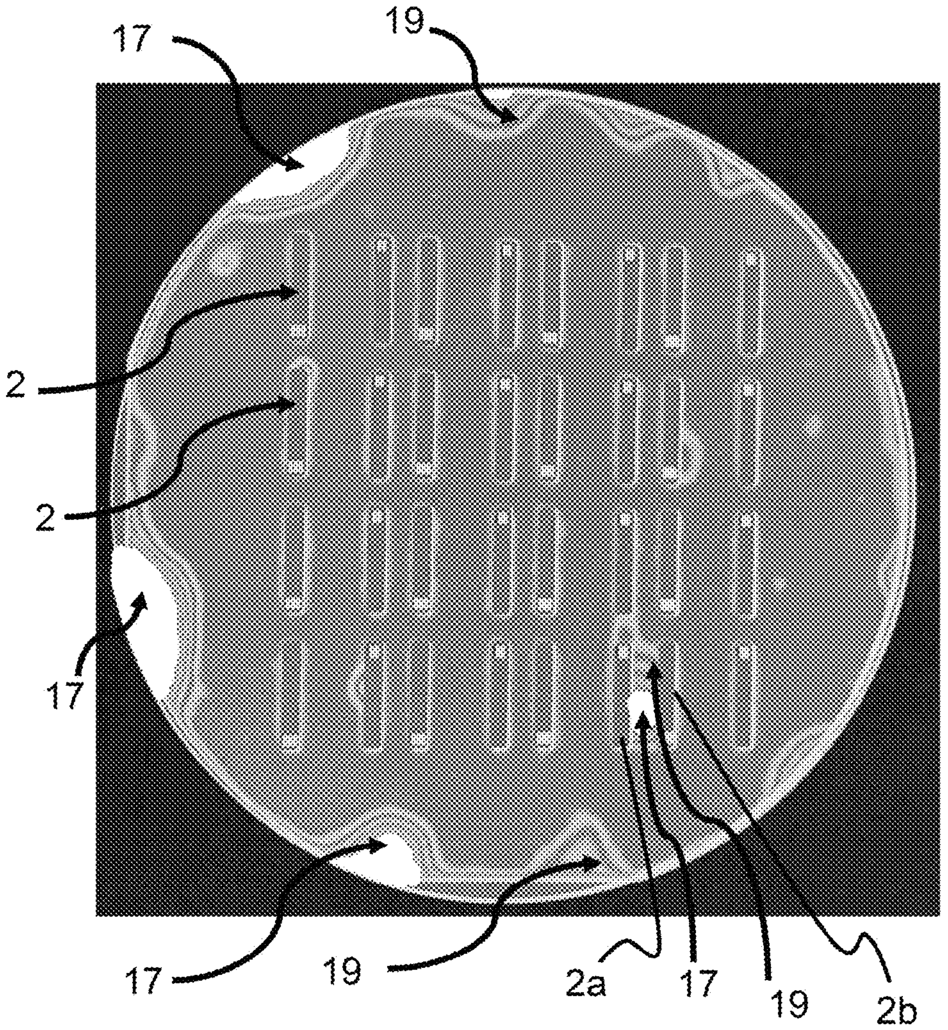
FIG. 7 shows further photographic representation of a substrate stack as a plan view.

FIG. 7 shows a further plan view of a substrate stack, for which the bond quality index $Q_1$ has been found to be 0.973. Fault regions F, 17 are located at the points where there are more than three Newton rings bordering one another. This corresponds to a spacing of more than 0.75 μm between the first substrate and the second substrate 3, 4. These regions are marked in white in FIG. 7. Regions of more than one Newton ring to less than three Newton rings are specified as acceptance region 19, G. Hence it is possible to recognize that only in the bottom right corner of FIG. 7, two cavities are directly affected by a fault region 17, these being the cavities 2*a* and 2*b*.

Figure 8:
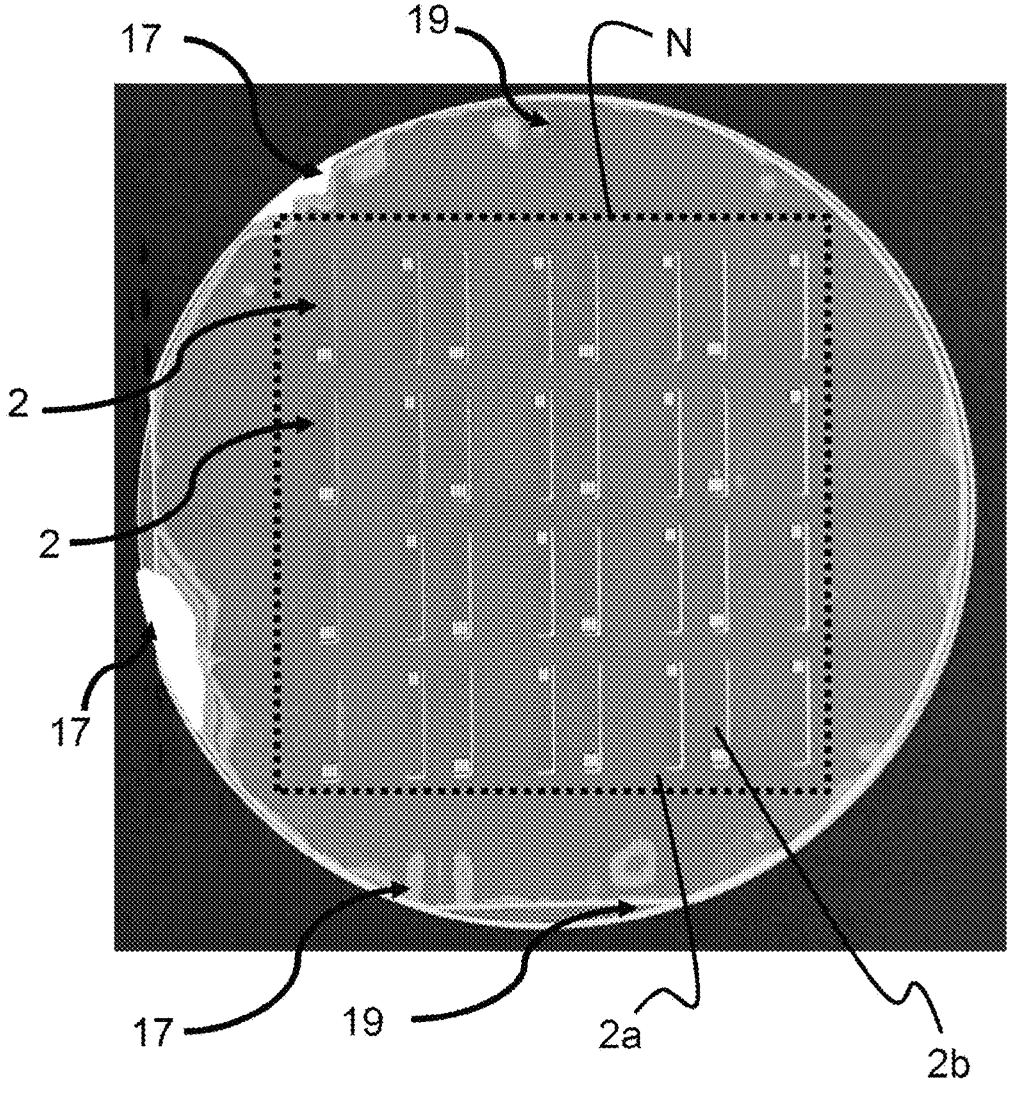
FIG. 8 shows further photographic representation of a substrate stack after implementation of the laser bonding method.

Referring to FIG. 8, the embodiment from FIG. 7 is shown, but after implementation of the laser joining method. All around all of the cavities 2 shown, therefore, there are laser bond lines 6 introduced, but they are not optically visible in this representation. Remaining in the margin region of the wafer are fault regions 17, F, which, however, are not affected for the useful region N, defined by the later enclosures 1.

Figure 9:
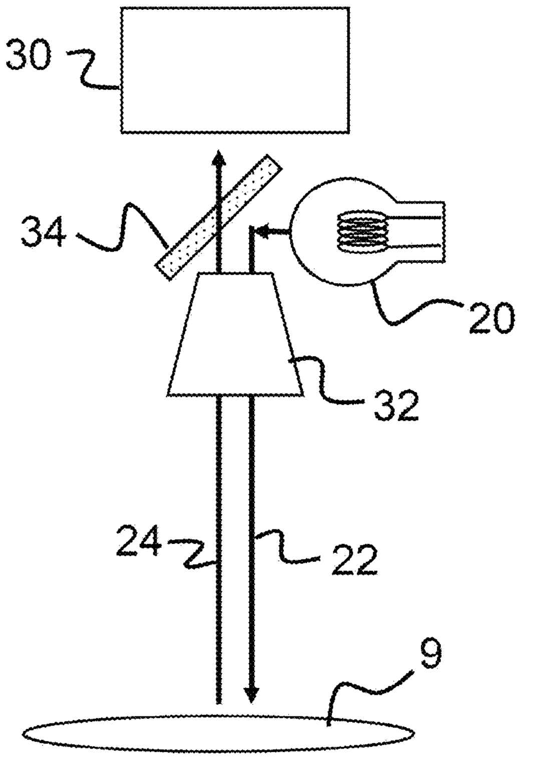
FIG. 9 shows an illumination and detector arrangement for determining Q indices.

FIG. 9 shows a further arrangement for determining the Q indices. A light source 20 casts a radiative input 22 first onto a beam splitter 34 and is deflected in the direction of substrate stack 9, where the radiative input 22 is incident perpendicularly onto the surface of the substrate stack 9. The radiative reflection 24 enters a lens 32 and, through the beam splitter 34 (e.g., a partially transmissive mirror), into the detector 30. The advantage of the coaxial illumination as used here for the substrate stack 9 is a more uniform distribution of the radiative input 22. The light source 20 may have a condenser optical system.

Figure 10:
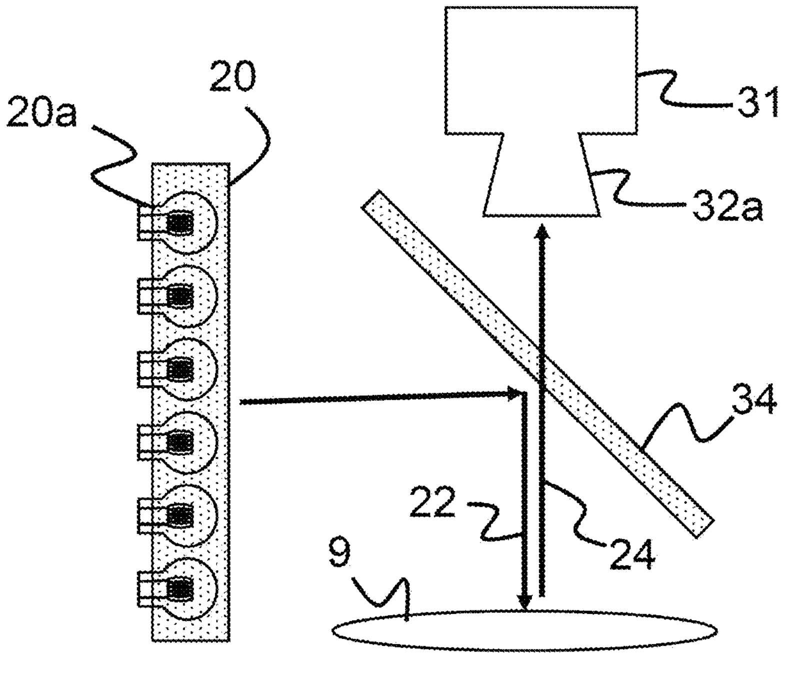
FIG. 10 shows a further illumination and detector arrangement for determining Q indices.

FIG. 10 shows a further arrangement for determining the Q indices, where a planar light source 20 is employed. For practical reasons, the light source 20 is arranged outside the beam path with the radiative reflection 24. The radiative input 22 by the planar light source 20 first impinges on the optical element 34, a beam splitter, for example, which has at least the base area of the substrate stack 9. If the beam splitter is arranged at a predefined 45° angle to the radiative reflection 24, the beam splitter 34 is able, for example, to have at least one 1.414 times the area of the dimensions of the substrate stack 9, i.e., for example, an area which corresponds to $\sqrt{2}$ times the area of the substrate stack 9 or more, in order to achieve optimum illumination of the substrate stack 9. The radiative reflection 24 passes through the optical element 34 and into the detector 31, which in this case has an integrated entry optical system 32*a*. The planar light source 20 may for example be an LED screen. The optical element 34 may be a semitransparent glass plate which is arranged, for example, at an angle of 45° to the surface of the substrate stack 9. FIG. 10 as well shows a coaxial illumination.

Figure 11:
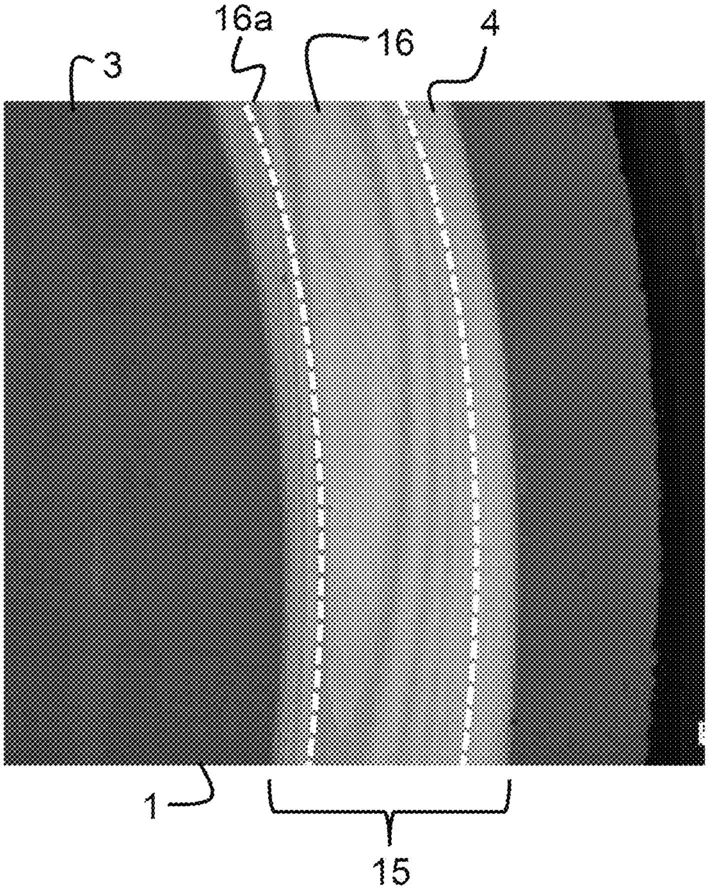
FIG. 11 shows a photographic representation of a further substrate stack with a metal-glass junction.
Figure 13:
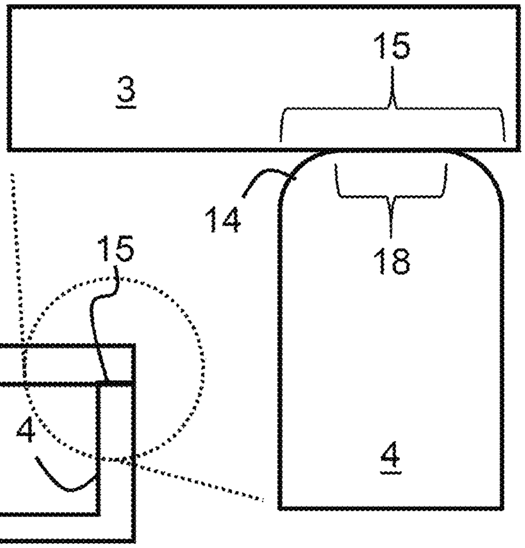
FIG. 13 shows a detail of the contact area from FIG. 12.
Figure 12:
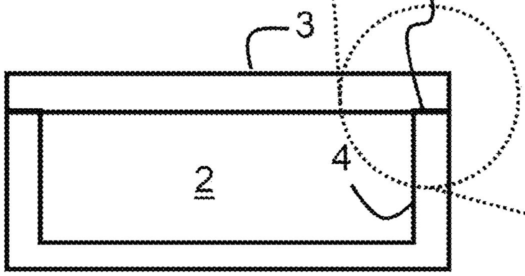
FIG. 12 shows lateral sectional view of an enclosure with a metal-glass junction.
Figure 14A:
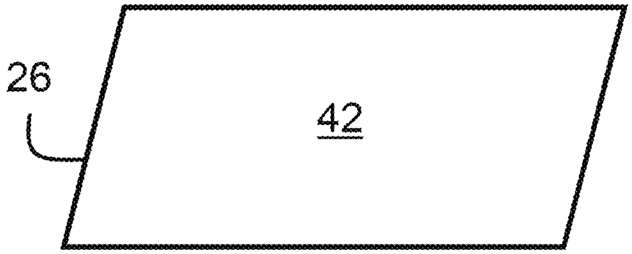
FIGS. 14A-D show steps of a method for the suppression of imaging noise.
Figure 14B:
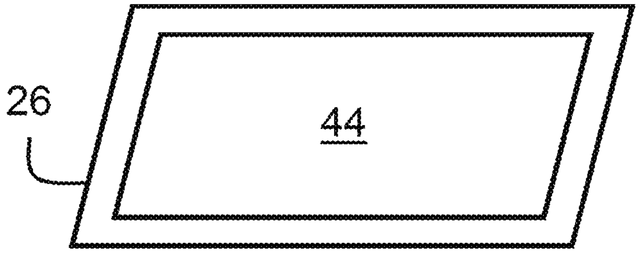
Figure 14C:
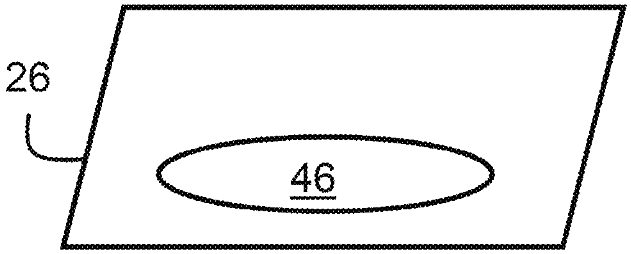
Figure 14D:
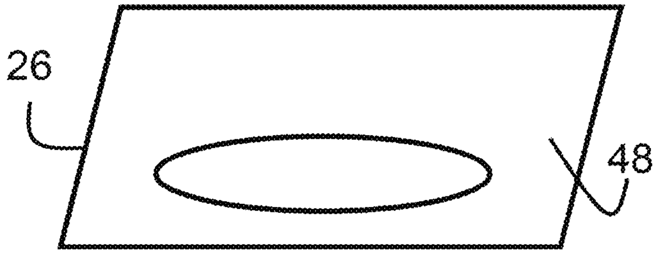

FIG. 11 shows the photographic reproduction of an enclosure 1, where a glass plate 3 is arranged on a metal ring 4. The contact area 15 between glass plate 3 and metal ring 4 is clearly apparent; a useful area 16 may be specified there with margins 16*a*, and so it is possible to evaluate the contact area 15 and ultimately to calculate a Q index. Schematically in relation to this, FIG. 12 shows a lateral sectional view, where the detail from FIG. 12, shown with FIG. 11 and FIG. 13, is emphasized with a dotted circle. The sapphire wafer 3 lies on the metal ring 4 of stainless steel. FIG. 13 further illustrates that the edges of the contact area 15 of the metal ring 4 have roundings 14 which typically come about during the production of metal components. In spite of the roundings 14 it is possible—as shown with FIG. 11—to produce an assembly between the sapphire wafer 3 and the metal ring 4 and to determine the quality of the connection by Q index as described earlier on above.

FIGS. 14A to 14D show method steps for improving the signal quality over possible background noise and also over the possibly imperfect uniformity of the radiative input 22 over the surface of the substrate stack 9. For this purpose, in a first step, with FIG. 14A, only the background is recorded by the detector; in other words, the radiation source 20 is switched off and there is no item (substrate stack 9 or enclosure 1) arranged in the image region 26. With the step of FIG. 14A, the background intensity $I_B$ is obtained. With the step of FIG. 14B, the radiation source 20 is activated and the image region 26 is illuminated, allowing the uniformity of the light distribution to be determined over the image region 26. With FIG. 14B, therefore, the intensity of the radiative distribution, $I_W$ is obtained. Lastly, the item (substrate stack 9 or enclosure 1) can be placed in the image region 26 and the intensity of the item in front of the background, $I_O$, can be obtained. The image corrected in this way and the intensities to be employed therefore come out as $$I_F = \frac{(I_O - I_B)}{(I_W - I_B)} \times \text{gain}.$$

Figure 15A:
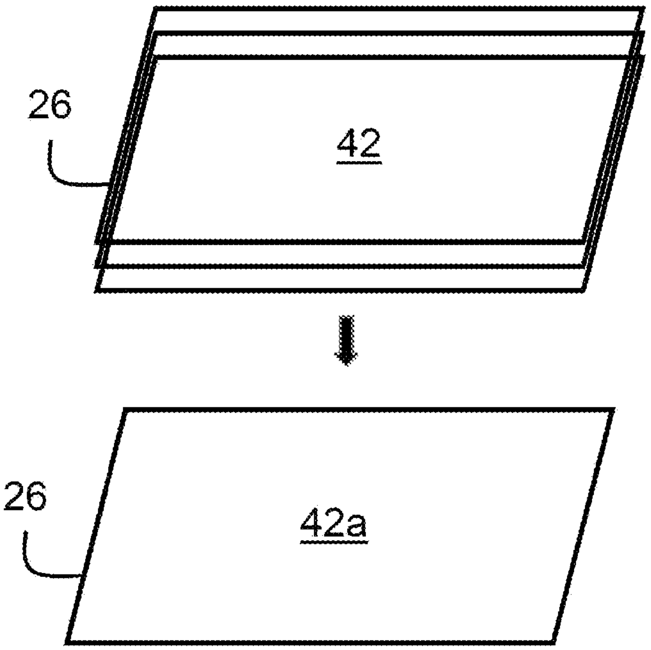
FIGS. 15A-C show steps of a further method for the suppression of imaging noise.
Figure 15B:
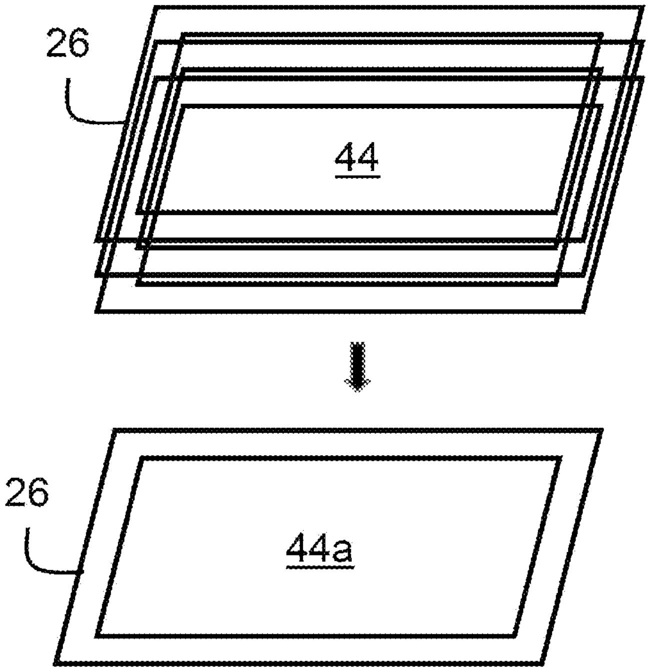
Figure 15C:
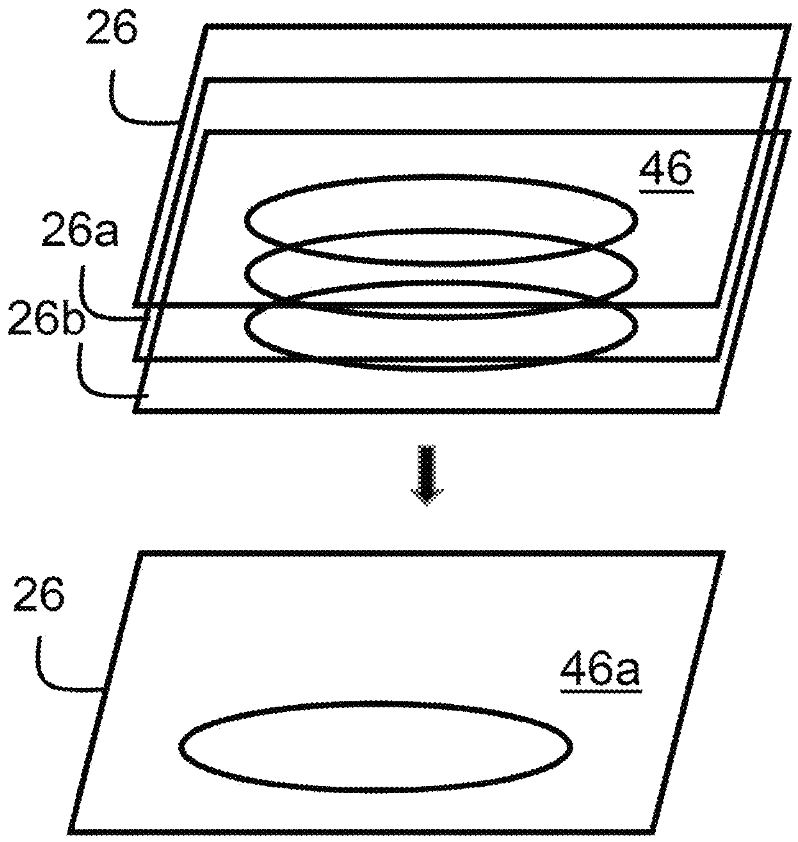

In order to achieve further suppression of noise, it is also possible to record multiple images of the same image region 26, with the same settings, and to form averages in each case. For example, the steps shown with FIGS. 14A, 14B and 14C can be carried out each twice, three times or more often, with an average computed in each case from the spatially resolved image intensities obtained. This is illustrated in FIGS. 15A, 15B, and 15C. Hence, with the step of FIG. 15A, the dark background 42 can be recorded multiply with the detector 30, being more particularly recorded digitally, and can be averaged over the image representations obtained, so as to give an averaged background 42*a*. For this purpose, for example, each pixel of the image region 26 can be considered individually, the intensities assigned to the pixel can be added up and divided by the number of available images, to give an averaged intensity. This may also be carried out accordingly for the steps shown with FIG. 15B and FIG. 15C. With the step shown in FIG. 15B, therefore, the radiative input 22 is recorded multiply, for example three times, and an averaged intensity 44*a* of the image region 26 is obtained. With the step shown in FIG. 15C, finally, the item (substrate stack 9 or enclosure 1) can be placed in the image region 26 and, with the light source 20 switched off, a further background measurement can be carried out. The ultimate actual measurement to obtain the Q index (shown in FIG. 14D) as well may be carried out multiply in the same way, in order also to level out influences which might occur during measurement, by averaging.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE SIGNS

- 1 enclosure
- 2 functional region or cavity
- 2*a*, 2*b* cavities in the region of a defect 17
- 3 first substrate or covering substrate
- 4 second substrate or base substrate
- 5 harbored item
- 6 joining zone or laser bond line
- 8 separating line
- 9 substrate stack or wafer stack
- 11 inside of the first substrate
- 12 inside of the second substrate
- 14 rounding
- 15 contact area
- 16 useful area
- 16*a* approximate outline of the useful area
- 17 fault region or defect F
- 18 touch contact area B
- 19 acceptance area G
- 20 radiation source
- 20*a* radiation source component, e.g. LED
- 21 maximum distance between the two substrates
- 22 radiative input
- 24, 24*a* radiative reflection
- 26 image region
- 30 detector
- 31 detector with integrated beam guide 32

32 beam guide, e.g. lens
34 beam splitter or semitransparent optical element
42 background distribution
**42*a*** averaged background distribution
44 light distribution of the radiative input 22
**44*a*** averaged light distribution
46 recorded image of the item (substrate stack 9 or enclosure 1)
**46*a*** averaged image recording
48 composite representation as a composite of steps 42, 44, 46
100 arrangement step
110 step of determining the height profile
120 calculation step for the first bond quality index $Q_1$
121 data provision
122 converting step
123 recognition step
124 correction step
125 contrast improvement
126 calculation step for the height profile
127 labeling step
128 calculation step for the Q factor $Q_1$ or $Q_2$
130 evaluation step for $Q_1$
135 feedback step
140 further-treatment step, especially laser joining
150 determination of second height profile
160 calculation step for $Q_2$
170 evaluation step for $Q_2$
175 labeling step in the event of fault
180 concluding treatment, especially singularization of the enclosures 1
A area of contact area
G acceptance area
N useful region
W width of the laser joining line 6

What is claimed is:

1. A process for producing and/or checking an assembly of a substrate stack, the process comprising:

planarly arranging at least one first substrate against a second substrate to form the substrate stack, the at least one first substrate and the second substrate being arranged directly against one another or on one another, so that at least one contact area is formed between the at least one first substrate and the second substrate at which the at least one first substrate is in direct planar contact with the second substrate, the at least one first substrate comprising a transparent material;

detecting a radiative reflection which comes about through irradiation of the substrate stack with a radiative input on the at least one contact area; and quantitatively ascertaining a first bond quality index ($Q_1$) of the contact area from the radiative reflection using the formula $Q_1=1-(A-G)/A$, wherein A is an area of the at least one contact area and G is an acceptance area.

2. The process of claim 1, wherein at least one the following is satisfied:

the acceptance area G describes an area for which the distance between the at least one first substrate and the second substrate is less than 5 μm; or the bond quality index $Q_1$ is greater than or equal to 0.8.

3. The process of claim 1, wherein one or more of the following is satisfied:

the process further comprises generating the radiative input by a monochromatic radiation source or generating the radiative input by a spectrally adapted radiation source; and/or the radiative input is a low-energy radiative input, wherein the radiative input has a radiant power which does not lead to melting or incipient melting of the at least one first substrate or the second substrate; and/or the radiative input is a gas vapor lamp or a laser.

4. The process of claim 1, further comprising reading off an interference pattern from the radiative reflection from superimposition of the radiative input with the radiative reflection on the at least one contact area.

5. The process of claim 4, wherein the pattern has an arrangement in which the pattern extends around one or more defects; and/or wherein a defect is characterized in that a distance between the at least one first substrate and the second substrate is greater than 5 μm.

6. The process of claim 1, wherein the substrate stack harbors at least one functional region, wherein the at least one functional region is configured as a harboring cavity for accommodating at least one harbored item; and/or wherein the at least one first substrate has an outer flat side and an all-around narrow side.

7. A process for producing a hermetically sealed enclosure, the process comprising:

planarly arranging at least one first substrate against a second substrate to form a substrate stack, the at least one first substrate and the second substrate being arranged directly against one another or on one another, so that at least one contact area is formed between the at least one first substrate and the second substrate at which the at least one first substrate is in direct planar contact with the second substrate, and the at least one first substrate comprising a transparent material;

detecting a radiative reflection which comes about through irradiation of the substrate stack with a radiative input on the at least one contact area;

ascertaining a first bond quality index $Q_1$ of the at least one contact area from the radiative reflection;

hermetically connecting the at least one first substrate and the second substrate to one another by direct joining of the at least one first substrate and the second substrate with one another in a region of the at least one contact area, so that a joining zone is formed which reaches into the at least one first substrate and into the second substrate and which directly meltingly joins the at least one first substrate and the second substrate to one another;

detecting a further radiative reflection, which comes about through further irradiation of the substrate stack with the radiative input on the at least one contact area; and quantitatively ascertaining a second bond quality index $Q_2$ of the at least one contact area from the further radiative reflection using the formula $Q_2=1-(A-G)/A$ or $Q_2=1-(N-G)/N$, wherein A is an area of the at least one contact area, G is an acceptance area, and Nis an area of a useful region.

8. The process of claim 7, wherein the second bond quality index $Q_2$ is greater than or equal to 0.95 and/or wherein $Q_2$ is greater than $Q_1$.

9. The process of claim 7, further comprising checking a hermetic assembly of the at least one first substrate and the second substrate by ascertaining a distance profile between the at least one first substrate and the second substrate.

10. The process of claim 9, further comprising:

again checking a hermetic assembly of the at least one first substrate and the second substrate after the hermetic connecting of the at least one first substrate and the second substrate by ascertaining a second distance profile; and comparing the second distance profile to the distance profile.

11. The process of claim 9, further comprising:

specifying a maximum distance of the distance profile between the at least one first substrate and the second substrate; and on exceedance of the maximum distance, undoing the enclosure, cleaning the enclosure, implementing an adaptive further joining step, and/or removing the enclosure from the process.

12. The process of claim 7, wherein hermetically connecting the at least one first substrate and the second substrate is carried out by a laser joining method, wherein the laser joining method comprises a laser generating a joining zone which reaches into the at least one first substrate and into the second substrate, and wherein the laser is guided all around the at least one first substrate and the second substrate and/or all around one or more cavities.

13. The process of claim 7, wherein the at least one first substrate is a covering substrate and the second substrate is a base substrate; and the covering substrate lies directly and unmediatedly against the base substrate or the enclosure further comprises an intermediate substrate which is arranged between the covering substrate and the base substrate, the covering substrate being arranged directly and unmediatedly against the intermediate substrate and the base substrate being arranged directly and unmediatedly against the intermediate substrate.

* * * * *